United States Patent [19]
Davies et al.

[11] Patent Number: 6,118,171
[45] Date of Patent: Sep. 12, 2000

[54] SEMICONDUCTOR DEVICE HAVING A PEDESTAL STRUCTURE AND METHOD OF MAKING

[75] Inventors: Robert B. Davies, Tempe; Peter J. Zdebel, Mesa, both of Ariz.

[73] Assignee: Motorola, Inc., Schaumburg, Ill.

[21] Appl. No.: 09/217,121

[22] Filed: Dec. 21, 1998

[51] Int. Cl.[7] ............................................. H01L 29/73
[52] U.S. Cl. ............................................. 257/586; 257/587
[58] Field of Search ........................................ 257/586, 587

[56] References Cited

U.S. PATENT DOCUMENTS

| | | | |
|---|---|---|---|
| 4,198,252 | 4/1980 | Hsu . | |
| 4,371,955 | 2/1983 | Sasaki . | |
| 4,504,332 | 3/1985 | Shinada | 257/586 |
| 4,545,109 | 10/1985 | Reichert . | |
| 4,697,198 | 9/1987 | Komori et al. . | |
| 4,796,070 | 1/1989 | Black . | |
| 4,851,362 | 7/1989 | Suzuki | 257/586 |
| 5,021,845 | 6/1991 | Hashimoto . | |
| 5,134,454 | 7/1992 | Neudeck et al. | 257/587 |
| 5,395,773 | 3/1995 | Ravindhran et al. . | |
| 5,434,093 | 7/1995 | Chau et al. . | |
| 5,548,154 | 8/1996 | Miller . | |
| 5,596,221 | 1/1997 | Honda | 257/588 |
| 5,600,168 | 2/1997 | Lee . | |
| 5,604,374 | 2/1997 | Inou et al. | 257/588 |
| 5,656,842 | 8/1997 | Iwamatsu et al. . | |

OTHER PUBLICATIONS

H. Lin et al., "Computer Analysis of the Double–Diffused MOS Transistor for Integrated Circuits," Transactions on Electron Devices, vol. Ed–20, No. 3, Mar. 1973, pp. 275–282.

S. Shimizu et al., "0.15μm CMOS Process for High Performance and High Reliability,"IEEE 1994, San Francisco, CA, pp. 67–70.

K. Lee et al., "Room Temperature 0.1 μm CMOS Technology with 11.8 ps Gate Delay," IEEE 1993, Washington, DC, pp. 131–134.

*Primary Examiner*—David Hardy
*Attorney, Agent, or Firm*—Robert F. Hightower

[57] ABSTRACT

A semiconductor device (10) is formed in a pedestal structure (16) overlying a semiconductor substrate (11). The semiconductor device (10) includes a base region (44) that contacts the corners (13) of the pedestal structure (16). Electrical connection to the base region (44) is provided by a conductive layer (28) that contacts the sides (12) and corners (13) of the pedestal structure (16).

20 Claims, 13 Drawing Sheets

6,118,171

SEMICONDUCTOR DEVICE HAVING A PEDESTAL STRUCTURE AND METHOD OF MAKING

BACKGROUND OF THE INVENTION

This invention relates, in general, to semiconductor device, and more particularly to bipolar transistors and junction field effect transistors.

Semiconductor devices such as bipolar devices are becoming increasingly important in high frequency applications. Traditionally, the collector region of the bipolar device is formed using an epitaxial layer in conjunction with a buried layer. The formation of a buried layer solely for the formation of a collector region contributes significantly to the manufacturing cost of the device.

In addition, conventional bipolar devices have an appreciable base-collector capacitance, which reduces the maximum frequency response of the device. As is readily apparent, structures and methods are needed that overcome at least the above problems found in the prior art. It would be advantageous to manufacture such structures in a cost effective and reproducible manner.

Figure 1:
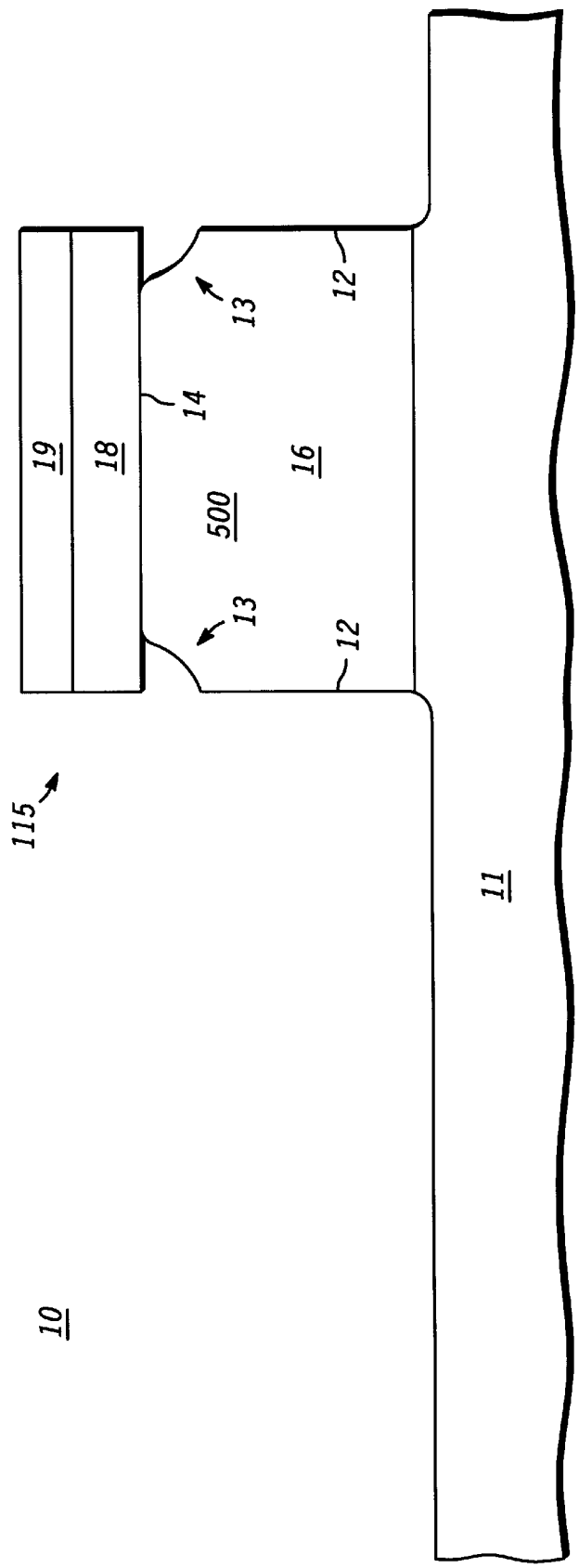
FIGS. 1–4 are enlarged cross-sectional views of a semiconductor device at various stages in a manufacturing process in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of a semiconductor device 10 at an early stage of a manufacturing process in accordance with the present invention. As shown in the example that follows, semiconductor device 10 is a bipolar device shown in an NPN configuration. However, one skilled in the art will appreciate that a PNP device can be formed by changing n-type regions to p-type regions and vice versa.

Semiconductor device 10 is formed over a semiconductor substrate 11 having an n-type epitaxial layer 500. To begin, a pedestal structure 16 is formed by removing a portion of epitaxial layer 500. For example, a masking layer 115 is used to pattern the location of pedestal structure 16. Masking layer 115 can be made from a layer of silicon nitride 19 over a layer of thermal oxide 18, hereinafter referred to as thermal oxide layer 18. These layers can be formed using a conventional Low Pressure Chemical Vapor Deposition (LPCVD) Process, a Plasma Enhanced Chemical Vapor Deposition (PECVD) Process, a thermal oxidation process, or similar technique. Masking layer 115 is patterned using a photolithographic pattern and etch process to pattern silicon nitride layer 19 and thermal oxide layer 18 such as is shown in FIG. 1. A Reactive Ion Etch (RIE) process is then used to partially remove the exposed portions of epitaxial layer 500 to provide pedestal structure 16.

As shown in FIG. 1, pedestal structure 16 has an upper surface 14, sides 12, and corners 13. The etch process used to form pedestal structure 16 includes an isotropic etch that removes a portion of the corners 13 of pedestal structure 16. In other words, an etch process is used to slightly undercut masking layer 115. This gives the corners 13 of pedestal structure 16 a slightly tapered profile that curves inward from the sides 12 of pedestal structure 16 to the upper surface 14 of pedestal structure 16.

Figure 2:
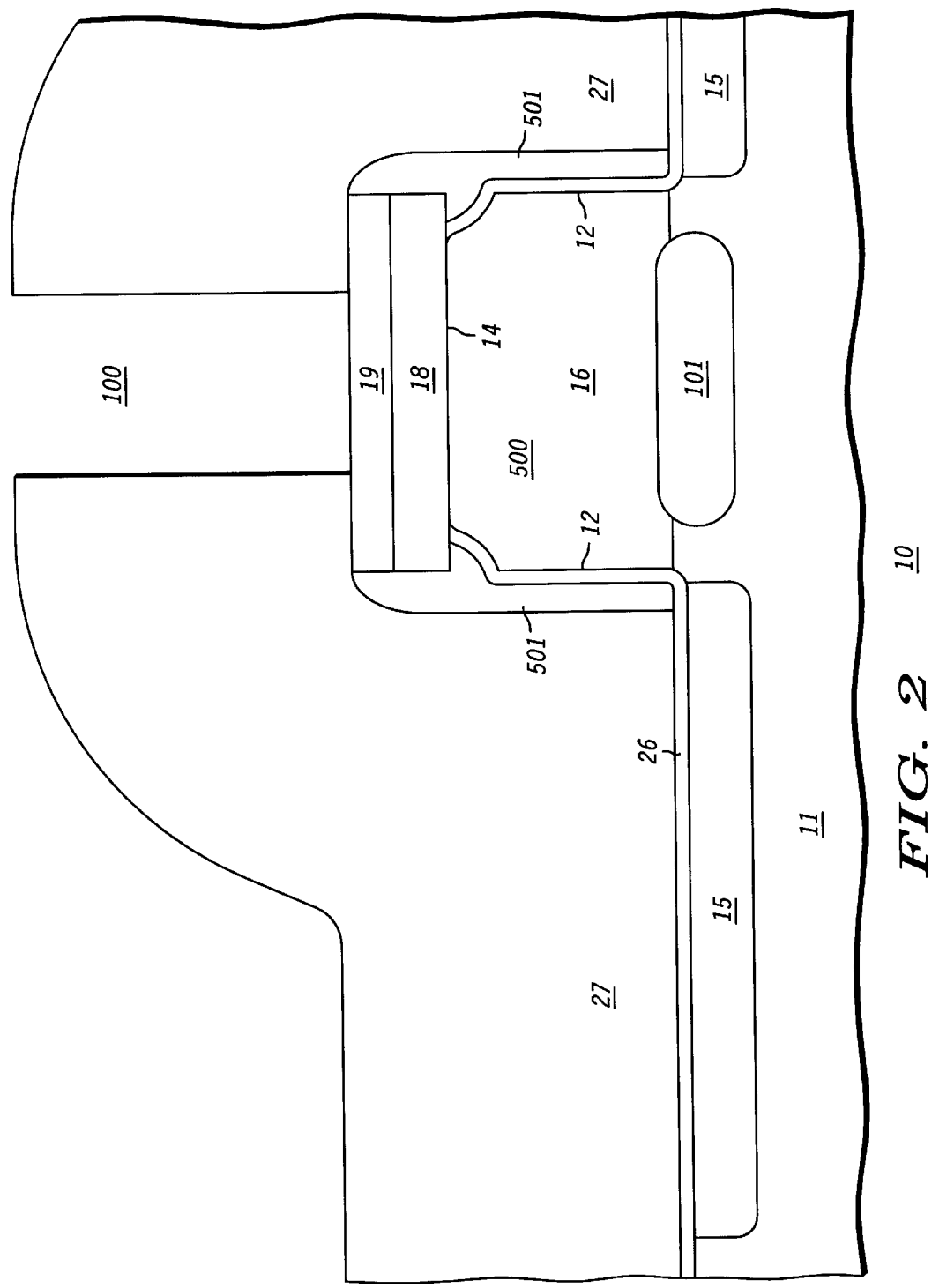

Referring now to FIG. 2, a thermal oxidation process can be optionally performed to form a thermal oxide layer 26 along the exposed surfaces of semiconductor substrate 11 and epitaxial layer 500.

Preferably, thermal oxide layer 26 is about 250 angstroms (Å) to 750 Å thick, and it should be understood that thermal oxide layer 26 may also be formed over the corners 13 of pedestal structure 16. Silicon nitride side-wall spacers 501 are subsequently formed and are preferably between 500 and 1500 angstroms thick.

A photolithographic mask (not shown) is formed over semiconductor substrate 11 and patterned to exposed the portions of thermal oxide layer 26 adjacent to pedestal structure 16. A doped region 15 is formed by doping semiconductor substrate with an n-type dopant such as arsenic. For example, an arsenic implant dose on the order of $1.0 \times 10^{14}$ atoms/cm$^2$ to $1.0 \times 10^{16}$ atoms/cm$^2$ and an implant energy on the order of 60 to 120 keV is suitable for forming doped region 15. Following the implantation of the dopant, the photolithographic mask is removed.

A planarization layer 27 is then formed to ultimately provide semiconductor substrate 11 with a relatively planar surface for subsequent processing. For example, planarization layer 27 can be a 7,000 Å to 15,000 Å layer of densified tetraethylorthosilicate (TEOS) that is deposited with a PECVD process. A densification anneal of 900° C. for 15 minutes in an oxygen rich atmosphere is then performed. This also serves to activate doped regions 15. Following formation, planarization layer 27 is patterned and etched to form an opening 100 over pedestal structure 16.

A doped region 101 is formed by doping semiconductor substrate 11 with an n-type dopant such as phosphorus. For example, a phosphorus implant dose on the order of $1.0 \times 10^{12}$ atoms/cm$^2$ to $3.0 \times 10^{13}$ atoms/cm$^2$ and an implant energy on the order of 400 keV is suitable for forming doped region 101. Following the implantation of the dopant, the photolithographic mask is removed. It is not necessary to anneal the dopant of doped region 101 at this time. It is possible to either rely on subsequent high temperature processing steps to activate the dopant, or perform the anneal later in the process flow.

Figure 3:
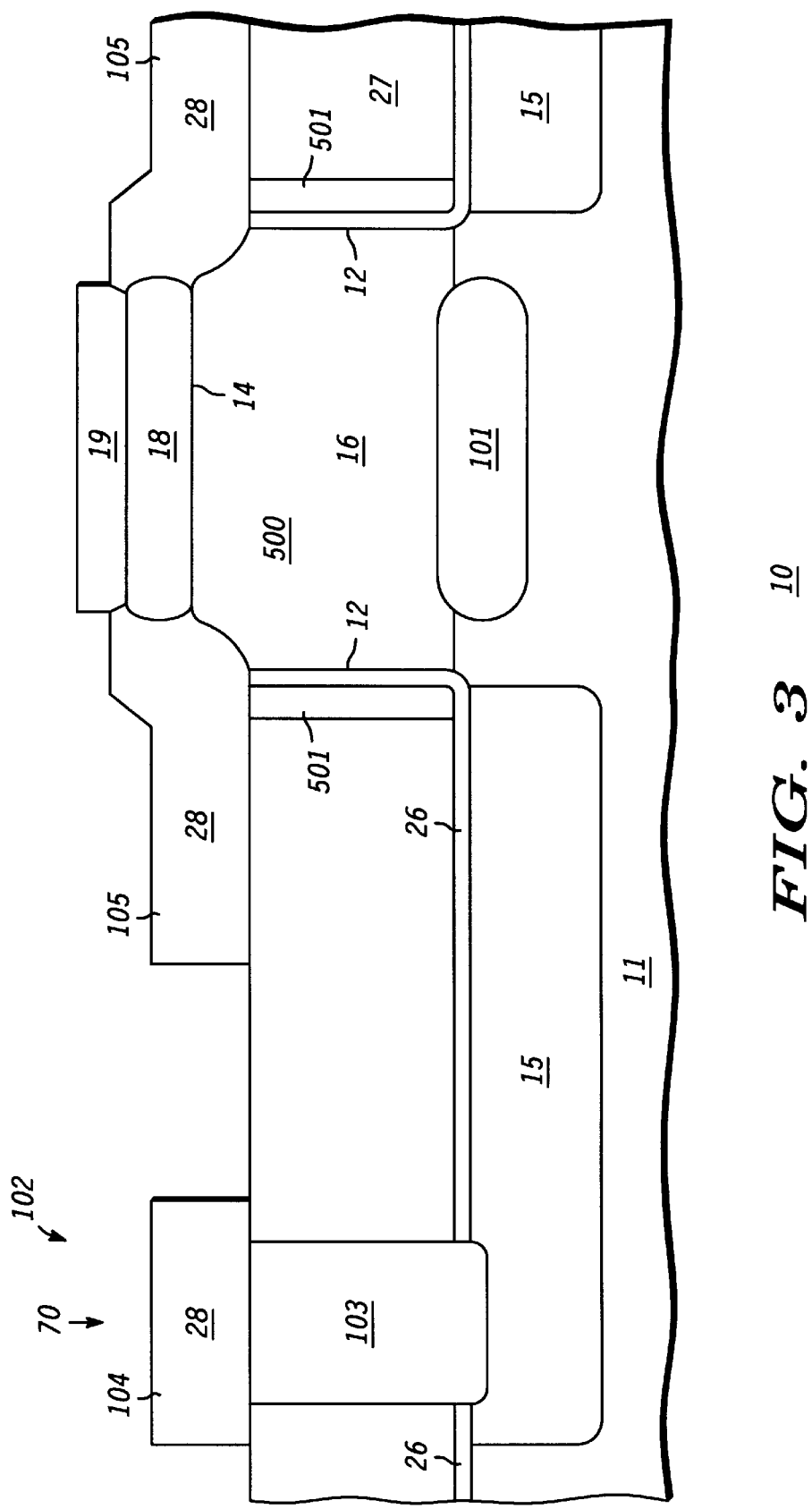

Referring now to FIG. 3, the process for making semiconductor device 10 continues with a chemical-mechanical polish (CMP) process to remove planarization layer 27 over pedestal structure 16 and to expose silicon nitride layer 19 on pedestal structure 16. Thereafter, a buried contact 103 is made to provide electrical contact to doped region 15 in semiconductor substrate 11. It should be understood that a variety of structures and techniques can be used to provide buried contact 103. What follows is the most efficient and cost effective known technique. A photolithographic mask (not shown) is patterned to expose a portion of planarization layer 27 over doped region 15. A reactive ion etch (RIE) is used to remove the exposed portions of planarization layer 27 and thermal oxide layer 26 to form an opening 70.

A plug 103 is formed in opening 70 by depositing and planarizing a conductive material such as polysilicon (not shown) over planarization layer 27. During deposition of the conductive material, a portion of the material fills opening 70 in planarization layer 27. A CMP or other etch process is used to remove the excess conductive material so that only plug 103 remains.

An etch process is then used to remove a portion of layer of silicon nitride 19 (see FIG. 1), silicon nitride spacers 501, and thermal oxide layer 18 so that the comers 13 of pedestal structure 16 are exposed. A conductive layer 28 is then formed such that it contacts the corners 13 of the pedestal structure 16 and plug 103 in opening 70. Conductive layer 28 is used to provide electrical connection to current carrying electrodes which are subsequently formed in pedestal structure 16. Conductive layer 28 also provides electrical connection to doped region 15, through conductive plug 103, which in turn, provides electrical connection to the collector region of semiconductor device 10.

As shown in FIG. 3, the presence of thermal oxide layer 18 does not allow conductive layer 28 to contact the upper surface 14 of pedestal structure 16. It should be understood that more of thermal oxide layer 18 can be removed so that conductive layer 28 contacts some of the upper surface 14 of pedestal structure 16. Conductive layer 28 is preferably about 1,000 Å to 3,000 Å thick and can be formed with an LPCVD deposition of either polysilicon or amorphous silicon. Following the deposition of conductive layer 28, a CMP process can be used to remove the portion (not shown) of conductive layer 28 that was over thermal oxide layer 18. In such a process, silicon nitride layer 19 is used as an etch stop.

An appropriate pattern and etch process is used to define conductive layer 28 so that the portion of conductive layer 28 that is used to provide electrical contact to buried contact 103 (contact 104) is electrically isolated from the portion of conductive layer 28 that is used to provide electrical connection to the base portion of semiconductor device 10. This portion of conductive layer 28 is referred to as contact 105.

Figure 4:
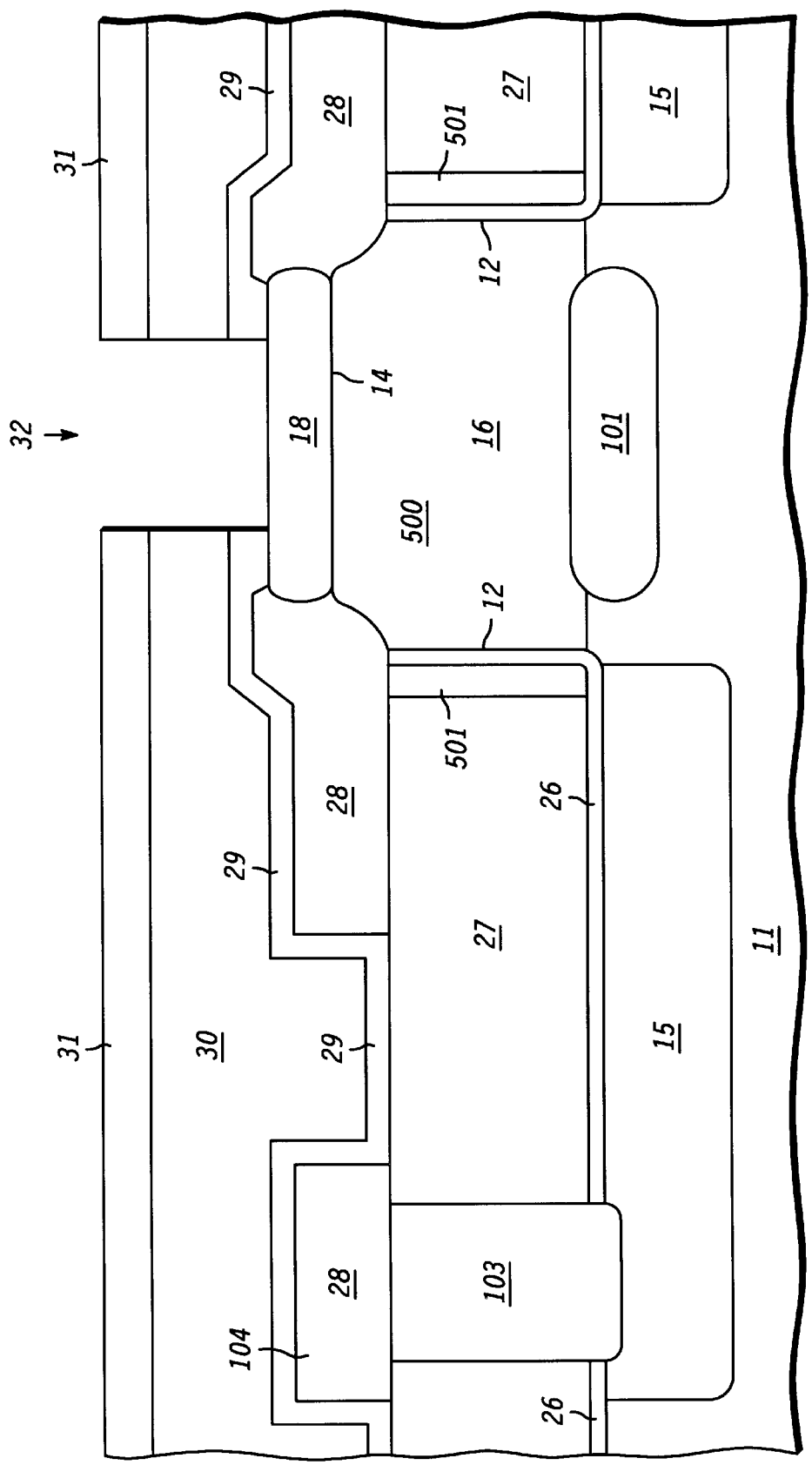

Turning now to FIG. 4, a sequence of dielectric layers are then formed to provide an opening 32 for the subsequent formation of a gate structure. For example, a silicon nitride layer 29 that is about 200 Å to 500 Å thick is deposited on conductive layer 28 using an LPCVD process. In FIG. 4, silicon nitride layers 19 and 29 are combined to show a single silicon nitride layer 29. Then a TEOS layer 30 that is about 2,000 Å to 5,000 Å thick is deposited on silicon nitride layer 29. Finally, a silicon nitride layer 31 that is about 500 Å to 1,500 Å thick is formed on TEOS layer 30 using an LPCVD process. It should be noted that a CMP process may be used during any point in the formation of the above mentioned dielectric layers to provide a planar surface across semiconductor substrate 11. Preferably, this would occur immediately after the formation of TEOS layer 30. Photolithographic mask and etch processes are then used to form opening 32 and expose a portion of thermal oxide layer 18 to complete the processing shown in FIG. 4.

Figure 5:
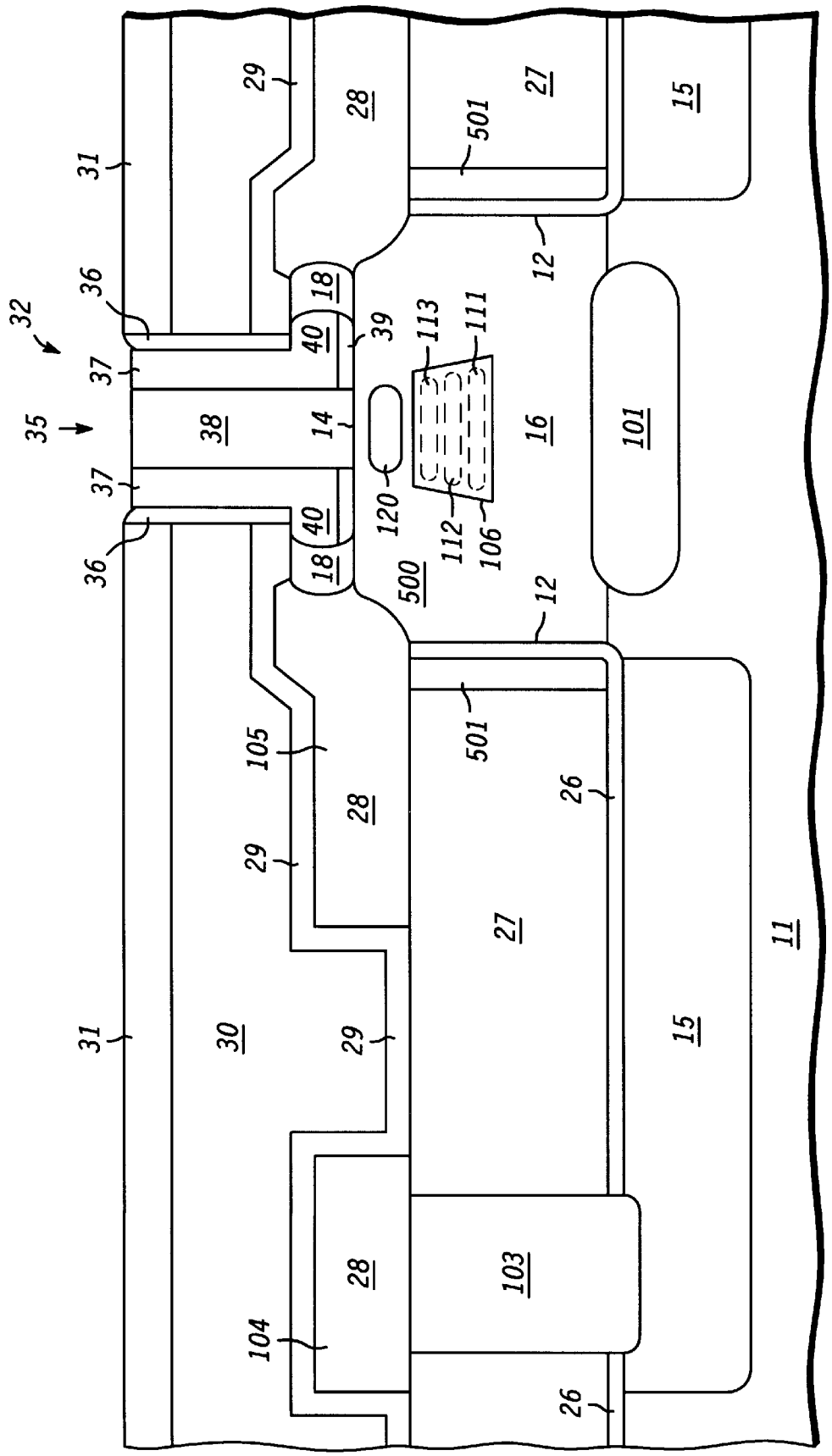
FIGS. 5–9 are enlarged cross-sectional views of a semiconductor device at various stages in a manufacturing process in accordance with an alternate embodiment of the present invention.

FIG. 5 is an enlarged cross-sectional view of semiconductor device 10 and is used to illustrate an example of forming emitter contact structure 35 on pedestal structure 16. To begin, a silicon nitride layer (not shown) is formed over silicon nitride layer 31 and along the sides of opening 32 and thermal oxide layer 18. Preferably, the silicon nitride layer is about 150 Å to 350 Å thick and is formed using an LPCVD process. An anisotropic etch is then used to remove the portion of the silicon nitride layer over thermal oxide layer 18 and over silicon nitride layer 31 to form silicon nitride sidewall spacers 36.

An isotropic etch is then used to remove the exposed portions of thermal oxide layer 18. It should be noted that the presence of silicon nitride sidewall spacers 36 along the sides of opening 32 prevents TEOS layer 30 from being etched. As shown in FIG. 5, the isotropic etch undercuts thermal oxide layer 18 to provide a foot region 40 that extends laterally from the sides of opening 32 adjacent to the upper surface 14 of the pedestal structure 16. A portion of thermal oxide layer 18 remains, and as shown in FIG. 3, has a thickness that is substantially equal to a thickness of the foot region 40 of emitter contact structure 35.

Once the portion of thermal oxide layer 18 exposed by opening 32 has been removed, an oxide layer 39 that is preferably about 20 Å to 150 Å thick is formed along the upper surface 14 of pedestal structure 16. An undoped layer of amorphous silicon 37, hereinafter referred to as amorphous silicon layer 37, is formed to line the sides of opening 32 and to fill the foot region 40 of emitter contact structure 35. Preferably, amorphous silicon layer 37 is about 200 Å to 1000 Å thick and is formed with an LPCVD process.

An RIE or appropriate etch is used to remove the portion of amorphous silicon layer 37, thereby exposing a portion of upper surface 14. A collector region 106 is formed in pedestal structure 16 by implanting pedestal structure 16 through the aperture provided by the remaining portions of amorphous silicon layer 37. Collector region 106 can be formed with a single or multiple implantation steps, but is preferably formed with three implantation steps. For example, a first phosphorus implant dose of about $7.0 \times 10^{12}$ atoms/cm$^2$ at an energy of about 200 keV (represented by region 111), a second phosphorus implant dose of about $7.0 \times 10^{12}$ atoms/cm$^2$ at 100 keV (represented by region 112), and a third phosphorus implant dose of about $4.0 \times 10^{11}$ atoms/cm$^2$ at an energy of about 25 keV (represented by region 113) can be used.

A base region 120 is also formed by implanting pedestal structure 16 through the aperture with a p-type dopant. A boron implant dose of about $3.0 \times 10^{13}$ atoms/cm$^2$ at an energy of about 10 keV can be used. It should be understood that the dosage and energy of each of these implant steps can be adjusted to tailor the performance characteristics of semiconductor device 10.

The formation of emitter structure 35 continues with the formation of a doped layer of amorphous silicon 38, hereinafter referred to as amorphous silicon layer 38, to provide a doped core for emitter structure 35. The doping concentration of amorphous silicon layer 38 can be adjusted to vary the operational performance of semiconductor device 10. It should be understood that in the process described above, emitter structure 35 can be formed with polysilicon or similar material instead of amorphous silicon, and if desired, can be formed from a single layer of material. A dry etch or CMP process is used to recess emitter structure 35 as shown in FIG. 5.

Figure 6:
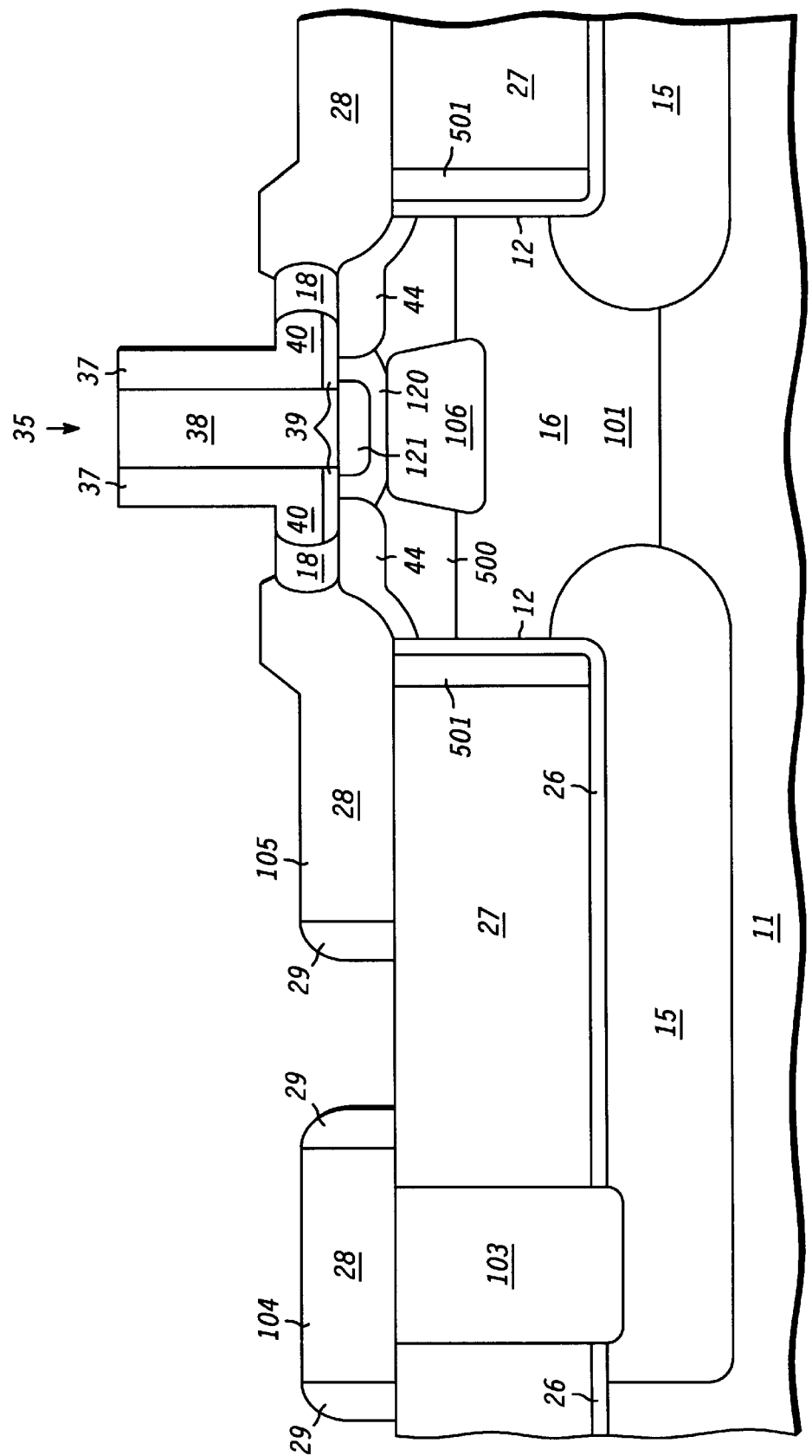

FIG. 6 is an enlarged cross-section view of semiconductor device 10 and is provided to illustrate the formation of base contact regions 44 in pedestal structure 16. To begin, silicon nitride layer 31 is removed using an appropriate wet etch solution. It should be noted that a portion of silicon nitride sidewall spacers 36 (not shown) would remain along the sides of emitter structure 35. Another wet etch solution is then used to remove TEOS layer 30.

An ion implantation process is then used to form base contact regions 44. For example, a p-type dopant such as boron is implanted vertically into pedestal structure 16 at an energy ranging from about 50 keV to 150 keV and a dose ranging from about $1\times10^{14}$ atoms/cm$^2$ to $5\times 10^{15}$ atoms/cm$^2$. Preferably, the dopant is implanted perpendicularly to the upper surface 14 of pedestal structure 16, but an implant angle ranging from about 0° to 7° may also be desirable. It may also be desirable to form a pre-implant screen oxide (not shown) along the exposed top surface of emitter structure 35 and conductive layer 28.

Following the implantation of the dopant, the remaining portions of silicon nitride sidewall spacers 36 are removed and an anneal step is performed to activate the implanted dopant. An anneal in an inert ambient at about 950° C. to 1150° C. for about 30 seconds to 45 minutes can be used to activate the dopant. The anneal process can give base contact regions 44, collector region 106, and doped regions 15 and 101 a shape such as is shown in FIG. 6. For example, base contact regions 44 extend laterally such that they contact the entire tapered profile of the corners 13 of pedestal structure 16. If a shorter or lower temperature anneal is used, then only a portion of base contact regions 44 will be juxtaposed to the tapered profile of the corner 13 of pedestal structure 16.

The anneal step will also drive dopant from amorphous silicon layer 38 to form an emitter doped region 121. Thus, during the operation of semiconductor device 10, emitter structure 35 is used to provide electrical connection to emitter region 121, contacts 105 and base contact regions 44 provide electrical connection to base region 120, and contact 104, plug 103, and doped region 15 and 101 provide electrical connection to collector region 106.

After the formation of base contact region 44, the processing of semiconductor device 10 may continue to include the formation of sidewall spacers and a silicidation process to enhance the electrical characteristics of conductive layer 28 as is known in the art.

One advantage of the process described above is that a bipolar device can be formed having a collector region that does not require the formation of a buried layer followed by a second epitaxial layer deposition. Instead, doped regions and buried contacts are used to provide an effective collector region. In addition, semiconductor device 10 is formed in an elevated electrode (i.e., pedestal structure 16) so that the parasitic substrate effects are significantly reduced and the high frequency response is improved.

Figure 7:
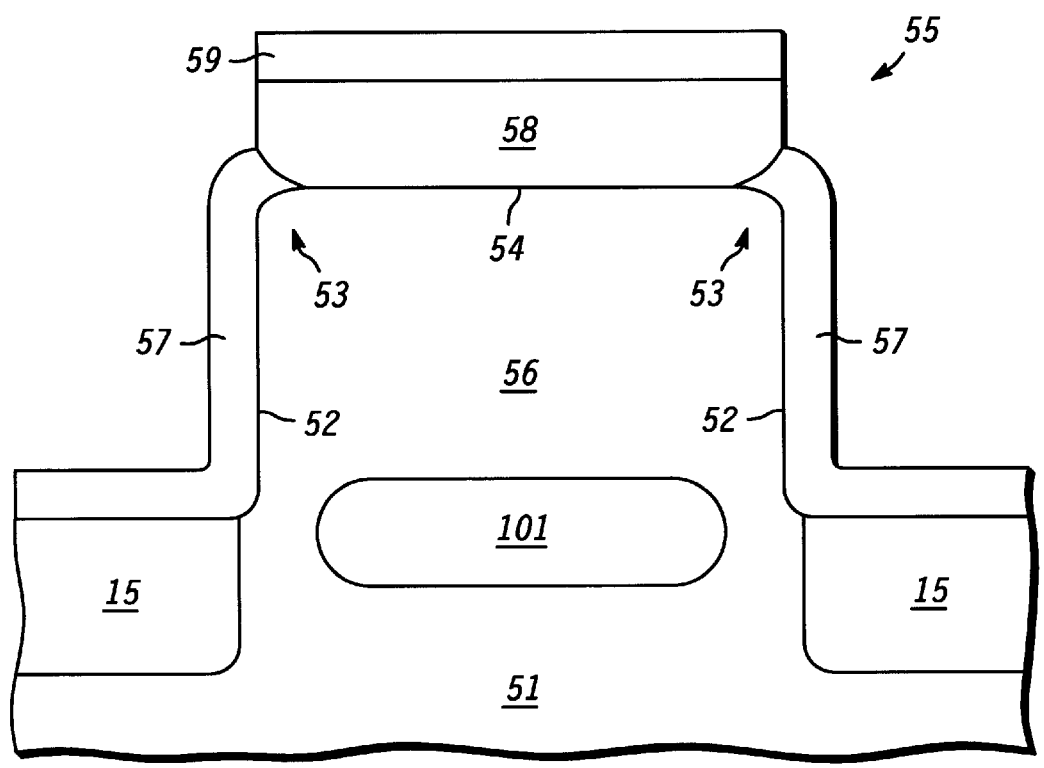

FIG. 7 is an enlarged cross-sectional view of a semiconductor device 50 at an early stage of a manufacturing process in accordance with an alternate embodiment of the present invention. Semiconductor device 50 is a bipolar device and is similar in some respects to semiconductor device 10 described above. However, the method for forming contact to the base contact regions and for forming the emitter contact are different. The following discussion focuses on these differences. Where appropriate, the same reference numbers have been used to refer to similar structures.

To begin, a pedestal structure 56 is formed by removing a portion of semiconductor substrate 51. For example, a masking layer 55 is used to pattern the location of pedestal structure 56. Masking layer 55 can be made from a layer of silicon nitride 59 over a layer of thermal oxide 58, hereinafter referred to as thermal oxide layer 58. Masking layer 55 is patterned using a photolithographic pattern and etch process to pattern silicon nitride layer 59 and thermal oxide layer 58 such as is shown in FIG. 7. An RIE process is then used to partially remove the exposed portions of semiconductor substrate 51 to provide pedestal structure 56.

As shown in FIG. 7, pedestal structure 56 has an upper surface 54, sides 52, and corners 53. After pedestal structure 56 is formed, a thermal oxidation process is performed to form silicon dioxide layer 57. Preferably, silicon dioxide layer 57 is about 300 Å to 1250 Å thick and extends partially under thermal oxide layer 58 along the upper surface 54 of pedestal structure 56. The formation of silicon dioxide layer 57 rounds the corners 53 of pedestal structure 56. Doped regions 15 and 101 are then formed as described above.

Figure 8:
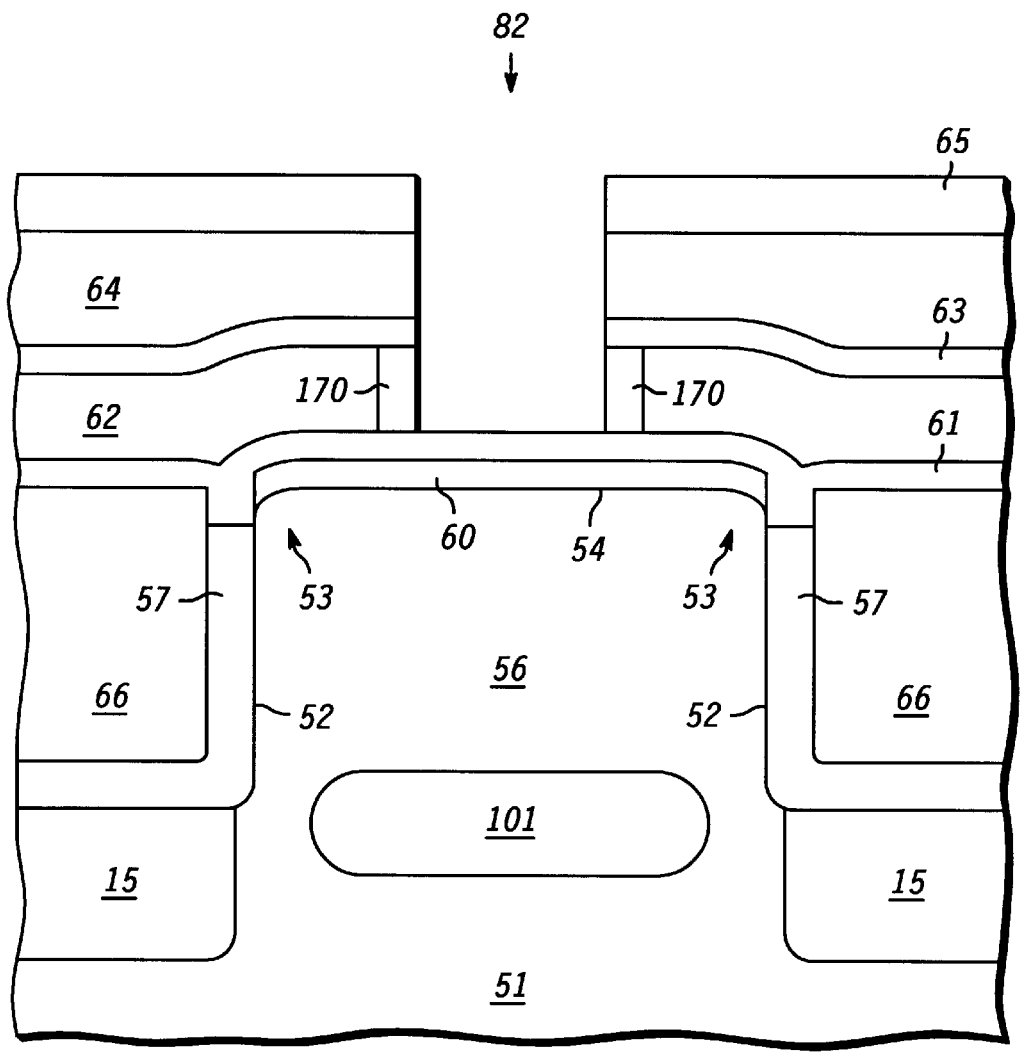

Referring now to FIG. 8, a planarization layer 66 is then formed to provide semiconductor substrate 51 with a relatively planar surface for subsequent processing. For example, planarization layer 66 can be a 7,000 Å to 11,000 Å layer of densified TEOS that is deposited with either an LPCVD or a PECVD process and then planarized with a CMP process. Appropriate wet etch processes are then used to remove the remaining portions of silicon nitride layer 59 and thermal oxide layer 58 (see FIG. 7) to expose the upper surface 54 of pedestal structure 56.

A thermal oxidation process is then used to form silicon dioxide layer 60 which is preferably about 50 Å to 150 Å thick. A silicon nitride layer 61 is then formed over silicon dioxide layer 60 and planarization layer 66 using an LPCVD process. Silicon nitride layer 61 can be about 200 Å to 500 Å thick. A conductive layer 62 is then formed on silicon nitride layer 61 using for example an LPCVD process that deposits a layer of polysilicon or amorphous silicon. Conductive layer 62 is preferably about 800 Å to 2,000 Å thick.

A sequence of dielectric layers are then formed prior to the formation of an opening 82 for the subsequent formation of a gate structure. For example, a silicon nitride layer 63 that is about 200 Å to 500 Å thick is deposited on conductive layer 62 using an LPCVD process. Then a TEOS layer 64 that is about 2,000 Å to 5,000 Å thick is deposited on silicon nitride layer 63. Finally, a silicon nitride layer 65 that is about 500 Å to 1,500 Å thick is formed on TEOS layer 64 using an LPCVD process. It should be noted that a CMP process may be used during any point in the formation of the above mentioned dielectric layers to provide a planar surface across semiconductor substrate 51. Preferably, this would be performed immediately after the formation of TEOS layer 64. Photolithographic mask and etch processes are then used to form opening 82 and expose a portion of silicon nitride layer 61 and a portion of conductive layer 62 along the sides of opening 82. A thermal oxidation process is then used to form silicon dioxide spacers 170 which serve to protect conductive layer 62 from subsequent processing and to electrically isolate conductive layer 62 from the gate structure to be formed in opening 82.

Figure 9:
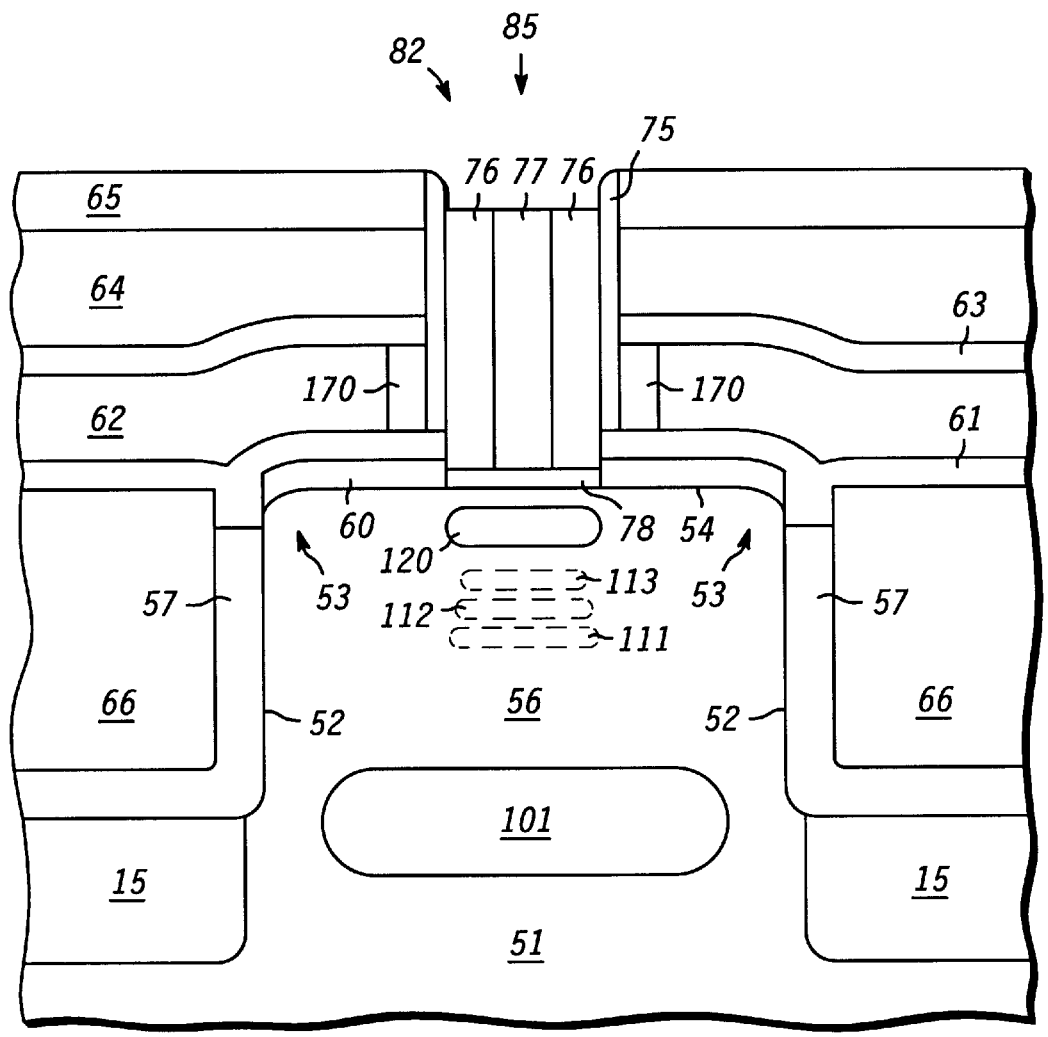

Referring now to FIG. 9, an example for forming an emitter structure 85 is provided. A silicon nitride layer (not shown) is formed on silicon nitride layer 65, along the sides of opening 82, and on the remaining portions of silicon nitride layer 61. The silicon nitride layer can be formed using an LPCVD process and is preferably about 100 Å to 400 Å thick. An RIE etch is then used to remove a portion of the silicon nitride layer 61 and a portion of silicon dioxide layer 60 to form silicon nitride sidewall spacers 75. An ion implant is then performed to create region 120 in epitaxial region 500. Boron atoms are implanted at an energy of approximately 10 keV and a dose of approximately $3 \times 10^{13}$ to form region 120. A wet etch process is then used to remove any remaining portion of silicon dioxide layer 60 to expose the upper surface 54 of pedestal structure 56 within the confines of sidewall spacers 75.

A thermal oxidation process is then used to form oxide layer 78. Preferably, oxide layer 78 has a thickness ranging from about 20 Å to 150 Å. The rest of emitter structure 85 is formed from a sequence of layers. For example, an undoped layer of amorphous silicon 76, hereinafter referred to as amorphous silicon layer 76, is formed to line the sides of opening 82. Preferably, amorphous silicon layer 76 is about 200 Å to 1000 Å thick and is formed with an LPCVD process. An RIE etch is used to remove the portion of amorphous silicon layer 76 and exposing oxide layer 78. Thereafter, a sequence of ion implantation steps is performed to form doped regions 111–113. For example, similar ion implantation steps that are used to form doped regions 111–113 of semiconductor device 10 (see FIG. 5). A wet etch is then used to remove the exposed portion of oxide layer 78 that is over the upper surface 54 of pedestal structure 56.

A doped layer of amorphous silicon 77, hereinafter referred to as amorphous silicon layer 77, is then formed with an LPCVD process to provide a doped core for emitter structure 85. It should be understood that in the process described above, emitter structure 85 can be formed with polysilicon or similar material instead of amorphous silicon, and silicon layers 76 and 77 can be doped using an ion implant as a dopant source instead of using an insitu-doped layer 77. A dry etch or CMP process is then used to remove amorphous silicon layer 76 and doped amorphous silicon layer 77 that is over silicon nitride layer 65 and to recess emitter structure 85 as shown in FIG. 9.

Figure 10:
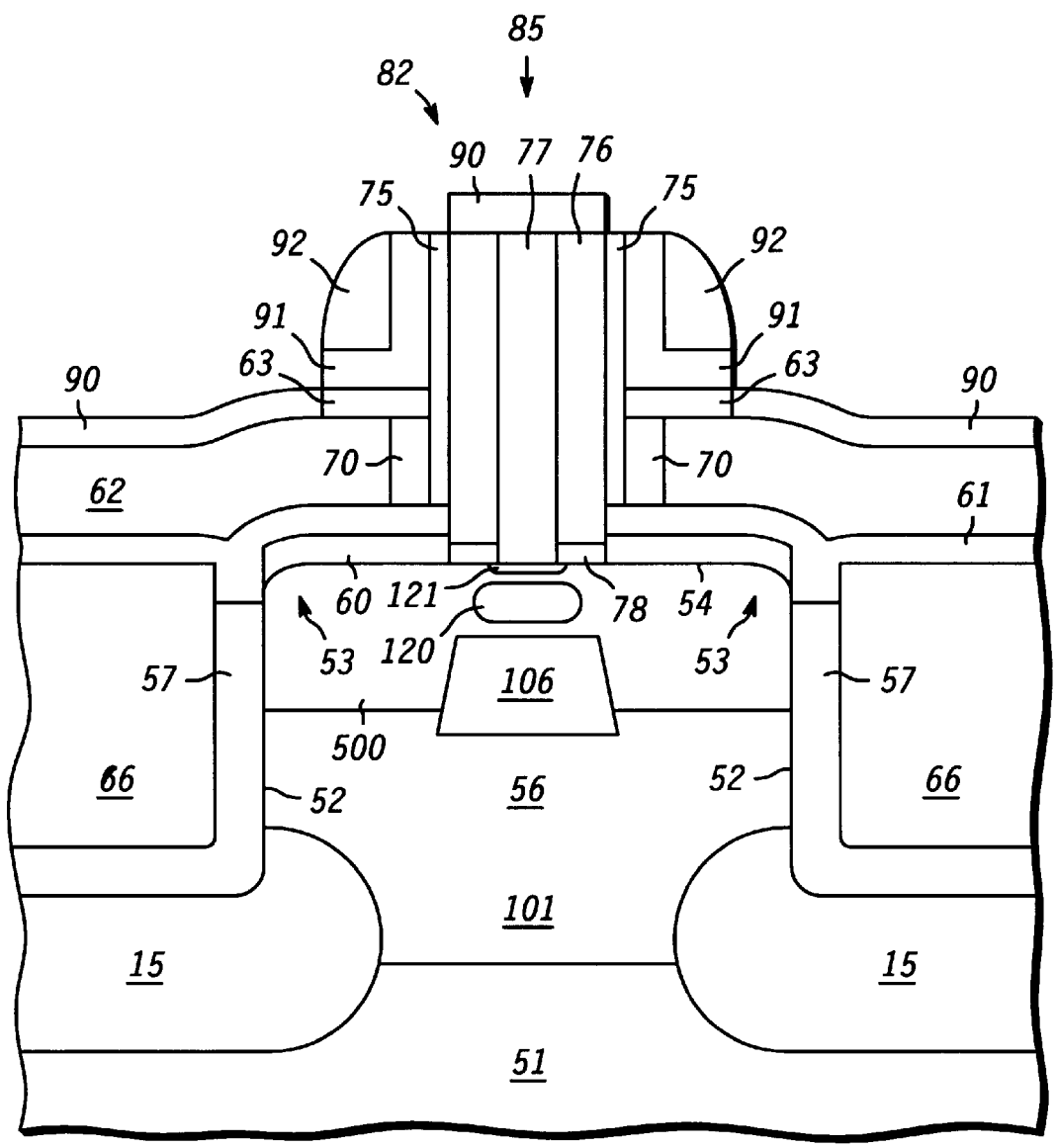
FIGS. 10 and 11 are enlarged cross-sectional views of further stages in the manufacturing process in accordance with the present invention.

Referring now to FIG. 10, the formation of semiconductor device 50 continues by removing the exposed portions of silicon nitride layer 65(FIG. 9) and TEOS layer 64(FIG. 9) using the appropriate wet etch solutions. A polysilicon layer 91 is then formed on silicon nitride layer 63 and across the top surface of emitter structure 85 using an LPCVD deposition. Polysilicon layer 91 can be about 50 Å to 250 Å thick. A silicon nitride layer (not shown) that is about 500 Å to 2,500 Å thick is formed on polysilicon layer 91 and patterned with an RIE to form sidewall spacers 92. Using sidewall spacers 92 as a hard mask, the exposed portions of polysilicon layer 91 and silicon nitride layer 63 are removed with the appropriate etch process. A portion of polysilicon layer 91 will remain both under sidewall spacers 92 and between sidewall spacers 92 and silicon nitride sidewall spacers 75.

A thermal oxidation process is performed to oxidize the exposed portions of conductive layer 62 and the top surface of emitter structure 85. Consequently, a silicon dioxide layer 90 that is about 150 Å to 500 Å thick is formed, which is subsequently used as a hard mask for the formation of base contact regions in pedestal structure 56.

Figure 11:
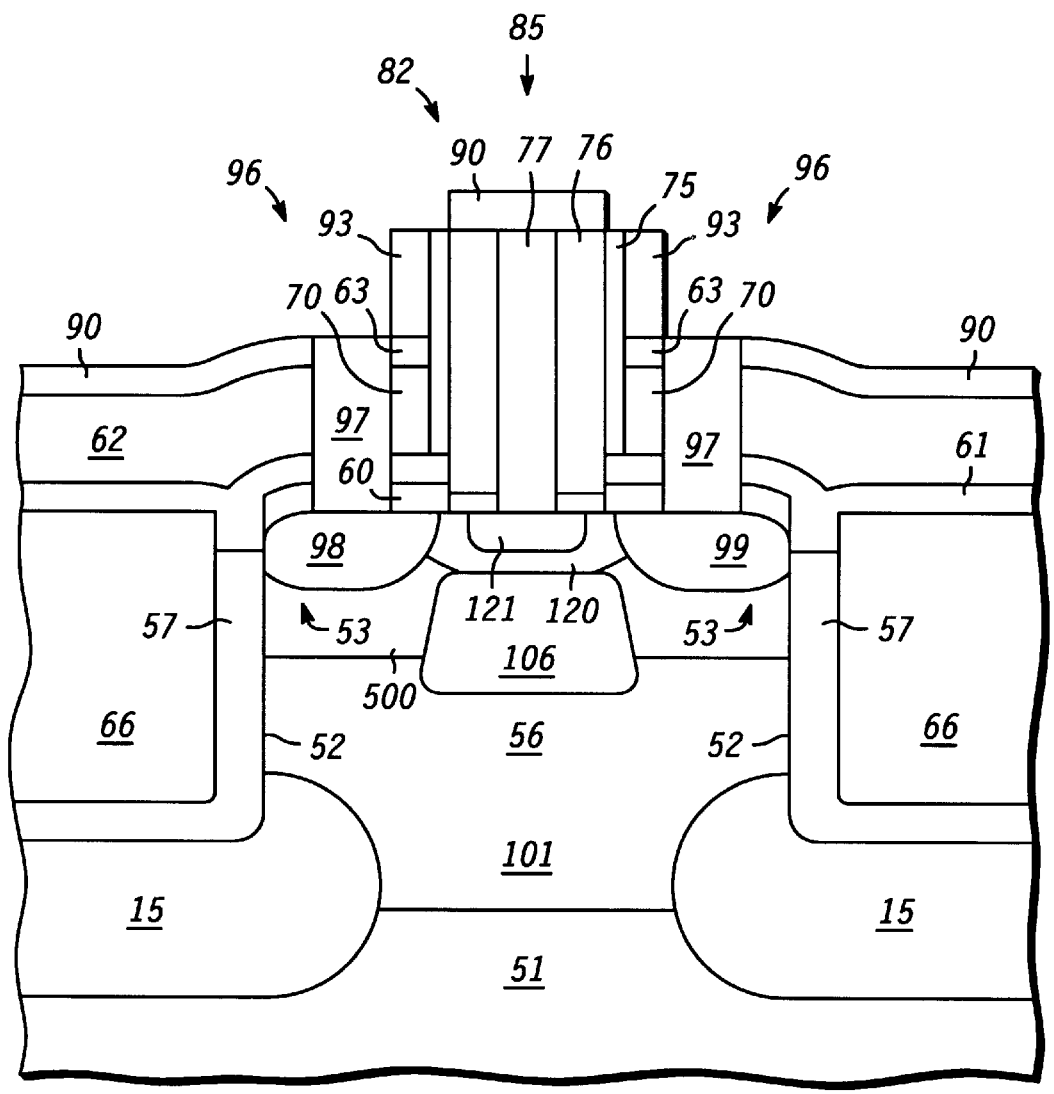

Turning now to FIG. 11, a wet etch process is used to remove sidewall spacers 92 (see FIG. 10) and an anisotropic etch is used to remove the portion of polysilicon layer 91 over silicon nitride layer 63. An oxidation process is then used to convert the remaining portions of polysilicon layer 91 along the sides of emitter structure 85 into silicon dioxide spacers 93. A wet etch solution such as phosphoric acid is then used to remove the exposed portions of silicon nitride layer 63 to expose the underlying portions of conductive layer 62. An anisotropic etch is then used to remove the exposed portions of conductive layer 62, silicon nitride layer 61, and silicon dioxide layer 60 to expose portions of the upper surface 54 of pedestal structure 56 through openings 96 adjacent to emitter structure 85.

A layer of undoped amorphous silicon or polysilicon 97, hereinafter referred to as polysilicon layer 97, is deposited and partially removed using an isotropic etch so that the remaining portions of polysilicon layer 97 contact the upper surface 54 of pedestal structure 56 and fill openings 96. An ion implantation process is then used to form base contact regions 98. For example, a p-type dopant such as boron is implanted into pedestal structure 56 at an energy ranging from about 10 keV to 30 keV and a dose ranging from about $1 \times 10^{14}$ atoms/centimeter$^2$ (cm$^2$) to $1 \times 10^{15}$ atoms/cm$^2$. Preferably, the dopant is implanted at an angle ranging from about 0° to 7° relative to the upper surface 54 of pedestal structure 56. Thermal oxide layers 90 and 93 act as a pre-implant screen oxide along the exposed top surface of polysilicon layer 97. The purpose of the implantation process is to dope the remaining portions of polysilicon layer 97 and conductive layer 62. A high temperature anneal step is then used to drive the implanted dopant from the remaining portions of polysilicon layer 97 into pedestal structure 56, thereby forming doped regions 15 and 101, collector region 106, base region 120, base contact regions 98, and emitter region 121. An anneal at about 950° C. to 1150° C. for about 30 seconds to 45 minutes is sufficient for this step.

One advantage of this alternate embodiment is that the formation of base contact regions 98 and 99 is self-aligned to emitter structure 85 through the formation of sidewall spacers 92 (see FIG. 10). This makes semiconductor devices formed in accordance with the present invention more tolerant to mis-alignment during the photolithographic process steps. Another feature of this alternate embodiment is that conductive layer 62 does not contact the corners 53 or the sides 52 of the pedestal structure 56 and is electrically isolated from the upper surface 54 of pedestal structure 56 by silicon nitride layer 61. This alternative embodiment also reduces the operational leakage current by rounding the corners 53 of pedestal structure 56 where emitter structure 85 passes over the sides 52 of pedestal structure 56.

Figure 12:
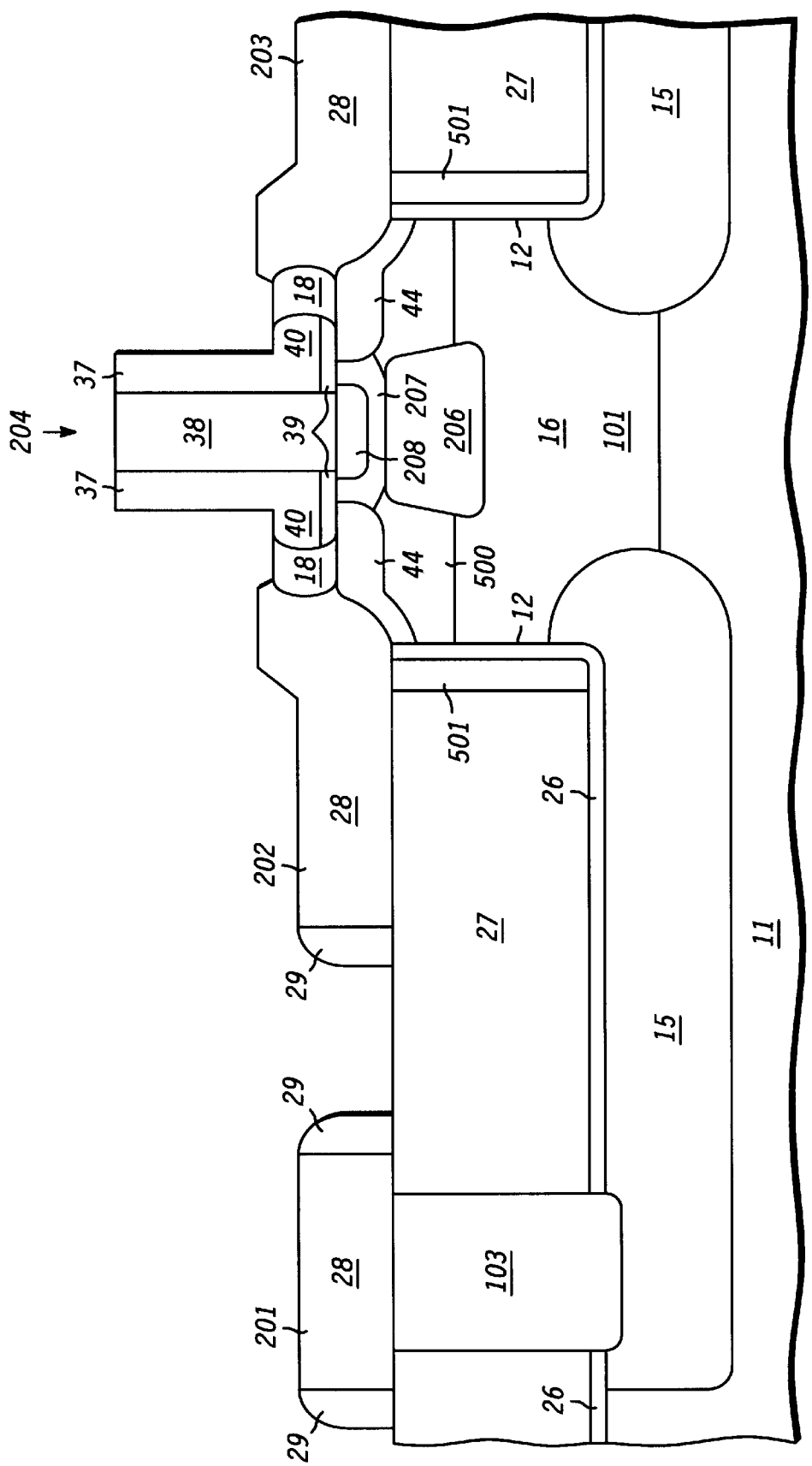
FIG. 12 is an enlarged cross-sectional view of an example of an alternate embodiment of the manufacturing process in accordance with the present invention.

In the embodiments described above, the structures and process of the present invention was used to manufacture bipolar devices. FIG. 12 is provided to illustrate an example of how many of the same structures and processes can be used to form a junction field effect transistor (JFET) 200. Where appropriate, the same reference numbers have been used to indicate that they are formed in a similar manner to the processes described above. Other structures that are similar have been given different references numbers for clarity.

JFET 200 has a lower field plate that is provided by doped regions 206, 101, and 15. Doped region 206 can be formed in a manner similar to the formation of collector region 106 (see FIG. 7). An electrical contact 201 is made to the lower field plate of JFET 200 using a portion of conductive layer 28 and plug 103, which can be made using one of the processes described above. The upper field plate of JFET 200 is provided with a gate structure 204 and doped region 208. Gate structure 204 can be formed using one of the processes described above to form emitter structure 35 (see FIG. 6), and doped region 208 is formed from the out diffusion of dopant from amorphous silicon layer 38 similar to emitter region 121 (see FIG. 6).

Source contact 202 and drain contact 203 are provided by portions of conductive layer 28 that are physically and electrically separated from each other. The flow of current from source contact 202 to drain contact 203 across pedestal structure 16 is through doped regions 44 and 207. Doped region 207 can be formed in a manner similar to the formation of base region 120 (see FIG. 7). During the operation of JFET 200, a voltage potential is placed between contact 201 and 204. This in turn places a voltage potential between doped regions 206 and 208 and channel region 207 that controls the flow of current through doped region 207. Therefore, gate structure 204 can be used to control the flow of current between source contact 202 and drain contact 203.

Figure 13:
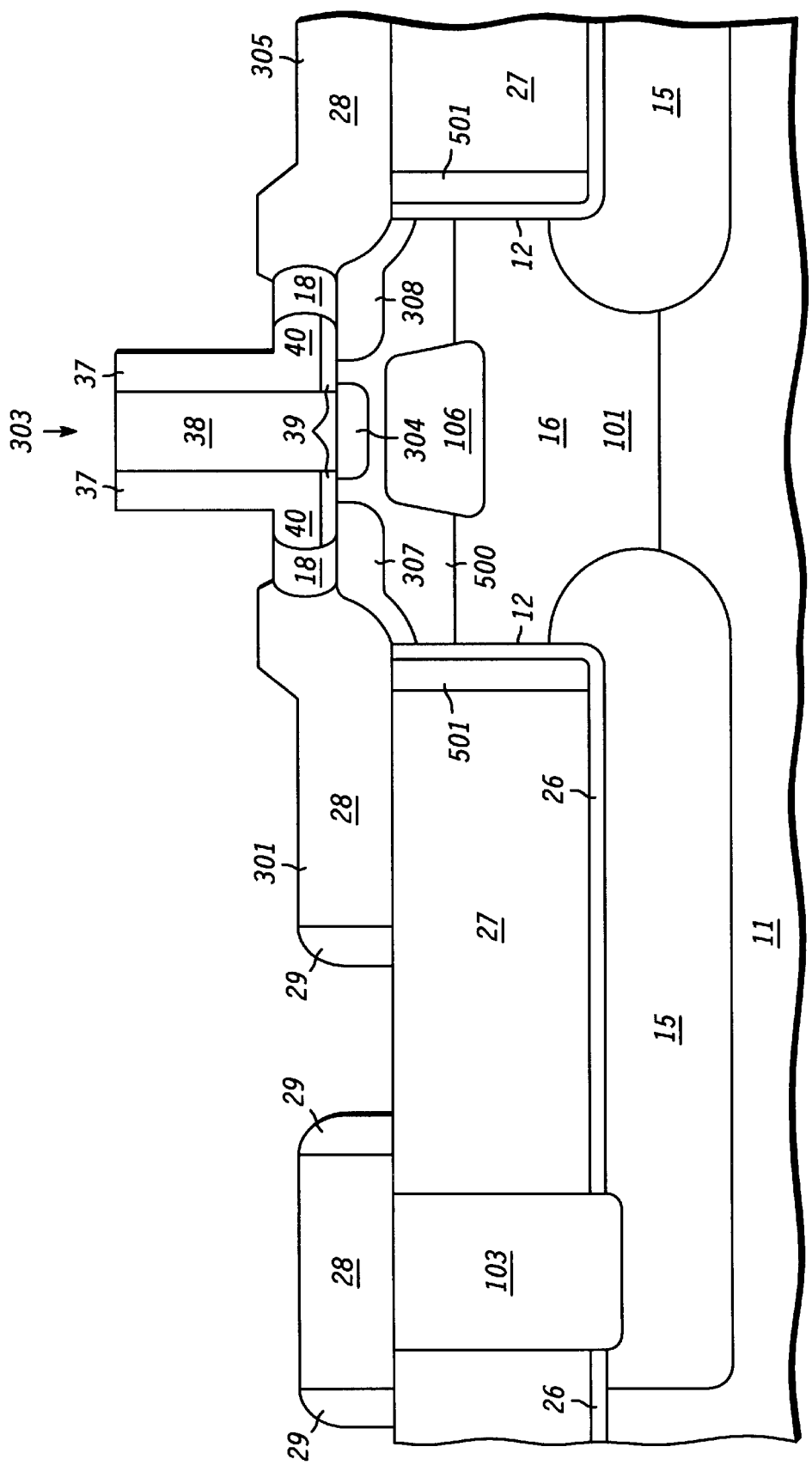
FIG. 13 is an enlarged cross-sectional view of an example of another alternate embodiment of the manufacturing process in accordance with the present invention.

In yet another embodiment of the present invention, many of the same structures and processes described above can be used to form a lateral bipolar device as demonstrated in FIG. 13. FIG. 13 is a cross-sectional view of a semiconductor device 300, and where appropriate, the same reference numbers have been use to refer to similar structures that can be formed using one of the processes described above.

Semiconductor device 300 is a lateral device meaning current flows across pedestal structure 16 from an emitter contact 301 to a collector contact 305. Consequently in this embodiment, it is not necessary to form plug 103, and thus, it is optionally shown in FIG. 13. In addition structures such as doped regions 15 or 106 may not be necessary for the operation of semiconductor device 300, but they may be used to alter the electrical characteristics (e.g., base-substrate capacitance) and are shown in FIG. 13 to illustrate how the device of this embodiment is compatible and integratable with the processes described above.

Emitter and collector contacts 301 and 305 are formed from portions of conductive material 28 that are physically and electrically isolated from each other to provide the required electrical operation. An emitter region 307 and a collector region 308 are formed in a manner similar to that used to form base contact regions 44 (see FIG. 6). However, it may be desirable to form emitter region 307 and collector region 308 separately using different photolithographic masks so that emitter region 307 can be formed with a higher doping concentration. This will improve some electrical characteristics of semiconductor device 300 such as the collector-emitter breakdown voltage ($BV_{CEO}$) and collector-base breakdown voltage ($BV_{CBO}$).

Semiconductor device 300 also has a base contact structure 303 that is formed in a similar manner as emitter structure 35 (see FIG. 6). It may also be desirable to form base contact structure 303 in a manner similar to that shown for emitter structure 85 in FIGS. 7–11. Base contact structure 303 is used to provide electric contact to base region 304. Base region 304 is formed similarly to emitter region 121 (see FIG. 6). It should be noted that the "base" of semiconductor device 300 consists of the combination of base region 304 and epitaxial region 500. Accordingly, the structures and processes of the present invention can be used to form a semiconductor device 300 that is a lateral PNP transistor. It should also be understood that the conductivity type of emitter region 307, base region 304, epitaxial region 500 and collector region 308 can be reversed to form an NPN transistor.

By now it should be appreciated that the present invention provides several structures, and methods for making the same, that can be formed to improve performance characteristics of a semiconductor device.

What is claimed is:

1. A semiconductor device comprising:
   a semiconductor substrate;
   a pedestal structure overlying the semiconductor substrate, wherein the pedestal structure has an upper surface, sides, a corner, the corner having a tapered profile that curves inward from the sides of the pedestal structure to the upper surface of the pedestal structure;
   an emitter structure overlying the upper surface of the pedestal structure, wherein the emitter structure includes:
      a first layer of undoped material; and
      a core comprising doped material, wherein the core is encompassed by the first layer of undoped material;
   a base region, a collector region, and an emitter region in the pedestal structure;
   a first doped region in the semiconductor substrate;
   a plug structure that is electrically coupled to the collector region by the first doped region; and
   a conductive layer that contacts the corner of the pedestal structure and is electrically coupled to the base region.

2. The semiconductor device of claim 1 wherein the conductive layer does not contact the upper surface of the pedestal structure.

3. The semiconductor device of claim 1 wherein the emitter structure has sides and includes a foot region that extends laterally from the sides of the emitter structure along the upper surface of the pedestal structure.

4. The semiconductor device of claim 1 wherein the base region extends laterally such that the base region contacts the entire tapered profile of the corner of the pedestal structure.

5. The semiconductor device of claim 1 further comprising a second doped region, wherein the second doped region electrically couples the first doped region to the collector region.

6. A semiconductor device comprising:
   a semiconductor substrate;
   a pedestal structure overlying the semiconductor substrate, wherein the pedestal structure has an upper surface, sides, and corners, the corners having a tapered profile that curves inward from the sides of the pedestal structure to the upper surface of the pedestal structure;
   an emitter structure overlying the upper surface of the pedestal structure, wherein the emitter structure has sides and a foot region that extends laterally from the sides of the emitter structure, and wherein the emitter structure includes a first layer of undoped material and a core comprising doped material, wherein the core is encompassed by the first layer of undoped material; and
   a conductive layer that contacts one of the corners of the pedestal structure.

7. The semiconductor device of claim 6 wherein the conductive layer does not contact the upper surface of the pedestal structure.

8. The semiconductor device of claim 7 further comprising a current carrying electrode in the pedestal structure that is juxtaposed to the tapered profile of one of the corners of the pedestal structure.

9. The semiconductor device of claim 8 wherein the conductive layer contacts the current carrying electrode at one of the corners of the pedestal structure.

10. The semiconductor device of claim 6 further comprising a dielectric material adjacent to the sides of the emitter structure, wherein the dielectric material has a thickness that is substantially equal to a thickness of the foot region of the emitter structure.

11. A semiconductor device comprising:
    a semiconductor substrate;
    a pedestal structure having an upper surface and a corner;

a first doped region in the pedestal structure;

a first dielectric layer overlying the upper surface of the pedestal structure, wherein the first dielectric layer has an opening that exposes a portion of the upper surface of the pedestal structure;

a gate structure overlying the upper surface of the pedestal structure, wherein a portion of the gate structure passes through the opening in the first dielectric layer and contacts the upper surface of the pedestal structure;

a second doped region in the semiconductor substrate;

a third doped region in the pedestal structure; and an electrical contact to the semiconductor substrate, wherein the second doped region couples the electrical contact to the third doped region.

12. The semiconductor device of claim 11 wherein the pedestal structure has a first corner and a second corner, and further comprises:

a fourth doped region in the pedestal structure and contacting the corner of the pedestal structure; and a fifth doped region in the pedestal structure and contacting the second corner of the pedestal structure.

13. The semiconductor device of claim 12 wherein the corner of the pedestal structure is rounded.

14. The semiconductor device of claim 12 further comprising a sixth doped region in the pedestal structure, wherein the sixth doped region contacts the fourth doped region and the fifth doped region.

15. The semiconductor device of claim 14 wherein the sixth doped region contacts the first doped region and the third doped region.

16. The semiconductor device of claim 15 further comprising a seventh doped region that electrically coughs the second doped region to the third doped region.

17. A semiconductor device comprising:

a semiconductor substrate;

a pedestal structure overlying the semiconductor substrate, wherein the pedestal structure has an upper surface, sides, and corners, the corners having a tapered profile that curves inward from the sides of the pedestal structure to the upper surface of the pedestal structure;

a base structure overlying the upper surface of the pedestal structure, wherein the base structure has sides and a foot region that extends laterally from the sides of the base structure; and a first conductive layer that contacts one of the corners of the pedestal structure.

18. The semiconductor device of claim 17 wherein the first conductive layer does not contact the upper surface of the pedestal structure.

19. The semiconductor device of claim 17 further comprising:

an emitter region and a collector region in the pedestal structure, wherein the emitter region contacts one of the corners of the pedestal structure and is coupled to the first conductive layer.

20. The semiconductor device of claim 19 wherein the emitter region has a doping concentration that is higher than the doping concentration of the collector region.

* * * * *